(12) United States Patent
Wadsworth et al.

(10) Patent No.: US 7,864,538 B2
(45) Date of Patent: Jan. 4, 2011

(54) SLIDER SUPPORT ARRANGEMENT

(75) Inventors: Edwin Jack Wadsworth, Longmont, CO (US); Christopher Anthony Pollard, Monument, CO (US); Matthew Thomas Starr, Lafayette, CO (US)

(73) Assignee: Spectra Logic Corporation, Boulder, CO (US)

( * ) Notice: Subject to any disclaimer, the term of this patent is extended or adjusted under 35 U.S.C. 154(b) by 282 days.

(21) Appl. No.: 12/032,437

(22) Filed: Feb. 15, 2008

(65) Prior Publication Data

US 2008/0137232 A1 Jun. 12, 2008

Related U.S. Application Data

(63) Continuation-in-part of application No. 11/626,745, filed on Jan. 24, 2007, which is a continuation of application No. 60/788,487, filed on Mar. 31, 2006.

(51) Int. Cl.
*H05K 7/20* (2006.01)
(52) U.S. Cl. .................. 361/727; 361/679.02; 361/724; 361/725
(58) Field of Classification Search .................. 361/727
See application file for complete search history.

(56) References Cited

U.S. PATENT DOCUMENTS

| | | | | | |
|---|---|---|---|---|---|
| 3,014,160 | A | * | 12/1961 | Brogden | 361/727 |
| 3,222,095 | A | * | 12/1965 | Gerus | 403/104 |
| 3,289,044 | A | * | 11/1966 | Ginsberg | 361/727 |
| 4,072,375 | A | * | 2/1978 | Boone | 312/334.8 |
| 4,608,621 | A | * | 8/1986 | Porter | 361/827 |
| 4,710,853 | A | * | 12/1987 | Reinhardt | 361/727 |
| 4,939,622 | A | * | 7/1990 | Weiss et al. | 361/727 |
| 6,392,892 | B1 | * | 5/2002 | Sobolewski et al. | 361/724 |
| 6,456,495 | B1 | * | 9/2002 | Wieloch et al. | 361/729 |
| 6,600,703 | B1 | | 7/2003 | Emberty et al. | |
| 6,639,751 | B2 | | 10/2003 | Brace et al. | |
| 6,650,961 | B2 | | 11/2003 | Deckers | |

(Continued)

FOREIGN PATENT DOCUMENTS

WO WO 2005/010661 A2 2/2005

(Continued)

OTHER PUBLICATIONS

Patent Application No., Rector et al.

(Continued)

*Primary Examiner*—Jayprakash N Gandhi
*Assistant Examiner*—Anthony Q Edwards
(74) *Attorney, Agent, or Firm*—Kenneth Altshuler

(57) ABSTRACT

A slide apparatus that provides horizontal support to a disc drive blade is described. The slide apparatus essentially includes a slider beam, a guide rail, a chassis and a retaining member. The slider beam possesses a slotted feature that extends at least partially along the length of the slider beam. The guide rail, which is adapted to be attached to a frame, constrains the slider beam to move only along the length of the guide rail. A retaining member is anchored to the chassis and extends into said slotted feature. The chassis, which supports the disc drive blade, is confined by the retaining member to move essentially only along the slotted feature in the slider beam.

21 Claims, 11 Drawing Sheets

U.S. PATENT DOCUMENTS

| | | | |
|---|---|---|---|
| 6,654,318 B2 * | 11/2003 | Coffin et al. | 369/30.48 |
| 6,711,011 B2 * | 3/2004 | Lee | 361/679.6 |
| 6,733,223 B2 * | 5/2004 | Mueller et al. | 414/281 |
| 6,749,277 B2 * | 6/2004 | Michaels | 312/334.5 |
| 6,879,490 B2 * | 4/2005 | Mattei et al. | 361/727 |
| 6,957,291 B2 | 10/2005 | Moon et al. | |
| 7,104,618 B2 * | 9/2006 | Chaloner et al. | 312/9.43 |
| 7,227,751 B2 * | 6/2007 | Robbins et al. | 361/695 |
| 7,505,251 B2 * | 3/2009 | Canfield et al. | 361/679.02 |
| 7,546,718 B2 * | 6/2009 | Vasta | 52/632 |
| 2003/0040836 A1 | 2/2003 | Deckers | |
| 2003/0049105 A1 * | 3/2003 | Mueller et al. | 414/277 |
| 2003/0076618 A1 | 4/2003 | Brace et al. | |
| 2004/0105187 A1 | 6/2004 | Woodruff et al. | |
| 2004/0181388 A1 | 9/2004 | Yip et al. | |
| 2004/0223253 A1 | 11/2004 | Woodruff et al. | |
| 2004/0264037 A1 | 12/2004 | Downey et al. | |
| 2004/0264038 A1 | 12/2004 | Heineman et al. | |
| 2004/0264039 A1 | 12/2004 | Armagost et al. | |
| 2004/0264040 A1 | 12/2004 | Armagost et al. | |
| 2004/0264041 A1 | 12/2004 | Kumpon et al. | |
| 2004/0264042 A1 | 12/2004 | Pollard et al. | |
| 2005/0007692 A1 | 1/2005 | Thompson et al. | |
| 2005/0047258 A1 | 3/2005 | Starr et al. | |
| 2005/0063089 A1 | 3/2005 | Starr et al. | |
| 2005/0065637 A1 | 3/2005 | Lantry et al. | |
| 2005/0195517 A1 | 9/2005 | Brace et al. | |
| 2005/0195518 A1 | 9/2005 | Starr et al. | |
| 2005/0195519 A1 | 9/2005 | Kumpon et al. | |
| 2005/0195520 A1 | 9/2005 | Starr et al. | |
| 2005/0219964 A1 | 10/2005 | Pollard et al. | |
| 2005/0246484 A1 | 11/2005 | Lantry et al. | |
| 2005/0267627 A1 | 12/2005 | Lantry et al. | |
| 2006/0061955 A1 | 3/2006 | Imblum | |
| 2006/0064953 A1 | 3/2006 | Wong | |
| 2006/0070059 A1 | 3/2006 | Starr et al. | |
| 2006/0095657 A1 | 5/2006 | Rector et al. | |
| 2006/0112138 A1 | 5/2006 | Fenske et al. | |
| 2006/0126209 A1 | 6/2006 | Starr et al. | |
| 2006/0134997 A1 | 6/2006 | Curtis et al. | |
| 2006/0161936 A1 | 7/2006 | Permut et al. | |
| 2006/0164928 A1 | 7/2006 | Starr et al. | |
| 2006/0215300 A1 | 9/2006 | Starr et al. | |

FOREIGN PATENT DOCUMENTS

WO PCT/US2005/045168 12/2005
WO PCT/US2005/046447 12/2005

OTHER PUBLICATIONS

U.S. Appl. No. 11/126,025.
U.S. Appl. No. 11/145,768, Downey et al.
U.S. Appl. No. 11/230,146, Starr et al.
U.S. Appl. No. 11/240,893, Starr et al.
U.S. Appl. No. 11/264,920, Lantry et al.

* cited by examiner

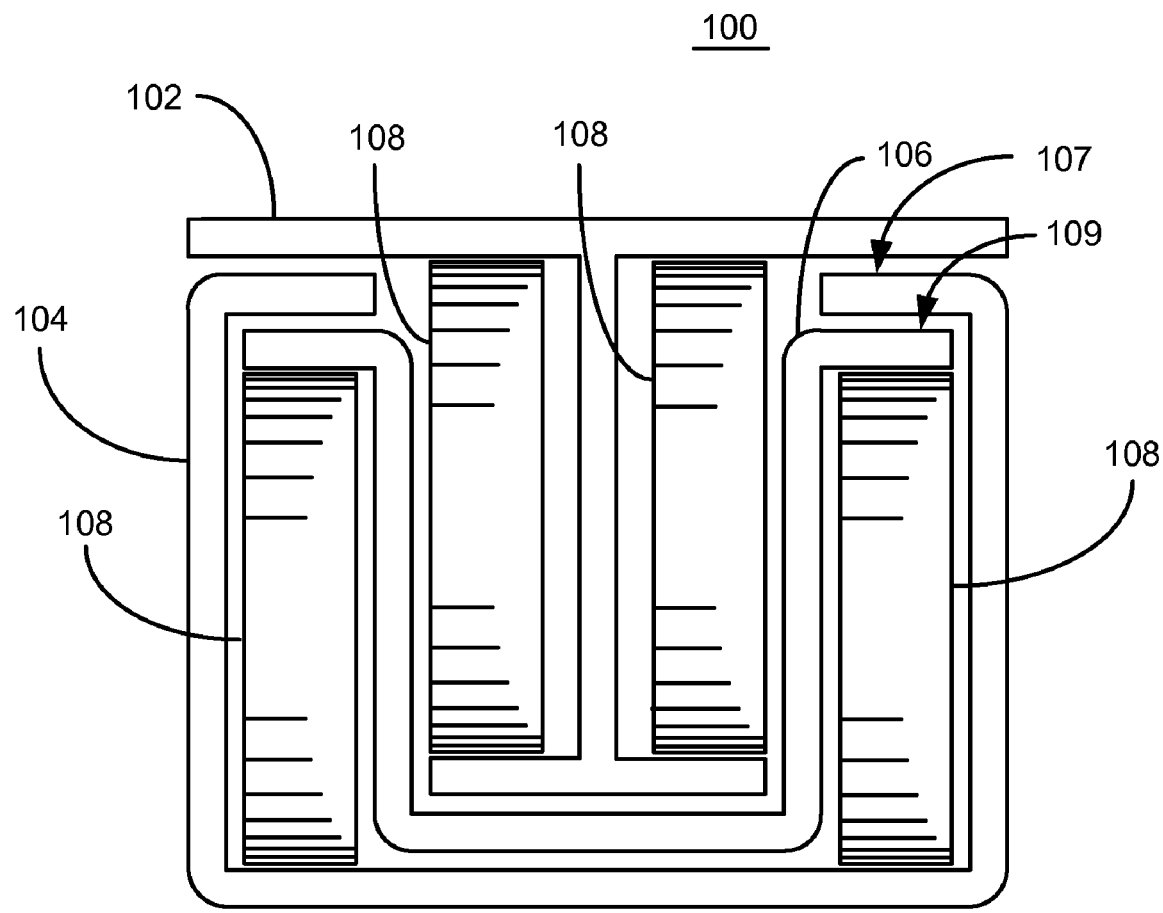
FIG. 1A *Prior Art*

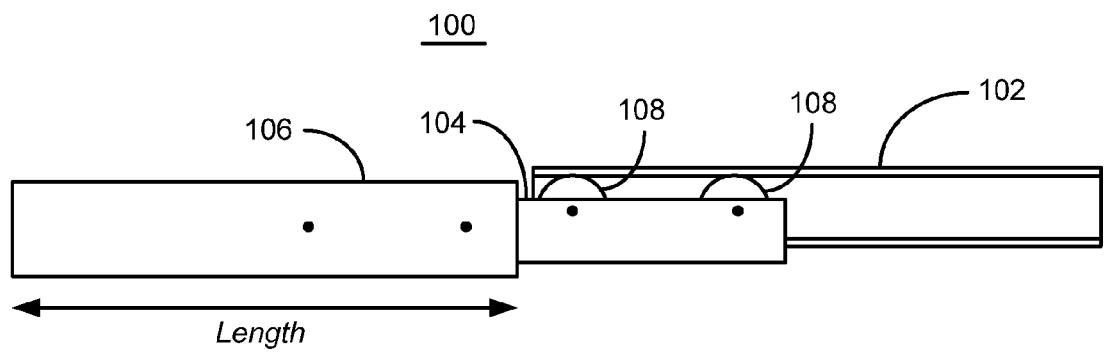
FIG. 1B *Prior Art*
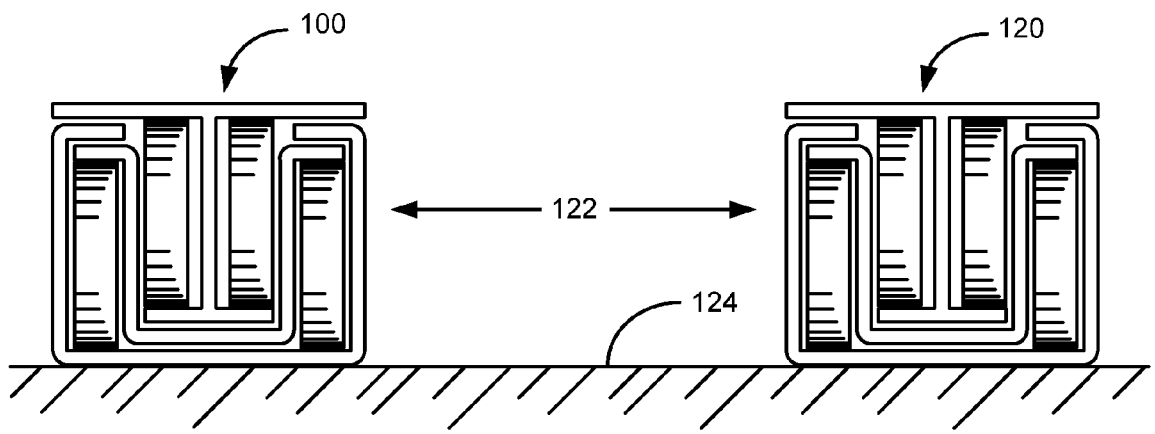
FIG. 1C *Prior Art*

SLIDER SUPPORT ARRANGEMENT

CROSS-REFERENCE TO RELATED APPLICATIONS

This application is a Continuation-in-Part Application of U.S. Ser. No. 11/626,745, entitled HIGH DENSITY ARRAY SYSTEM WITH ACTIVE STORAGE MEDIA SUPPORT STRUCTURES, filed Jan. 24, 2007 which is incorporated herein by reference.

BACKGROUND OF THE INVENTION

1. Field of the Invention

The present invention is directed to a slider support arrangement that is useful in providing structural support in a geometrically constrained environment to a data storage element frame that is required to move in a drawer-like manner in and out of a data storage unit.

2. Description of Related Art

Presently, bottom mount slider systems used in drawers are generally assembled with a slider beam and chassis assembly substantially contained within a U-shaped guide rail. Some bottom mount slider systems are arranged in three stage configurations generally comprising a slider beam, a guide rail and chassis which also comprise U-shaped configurations. An example of a typical prior art three stage bottom mount slider system 100 is shown in FIGS. 1A and 1B.

As shown in FIG. 1A, the guide rail 106 is a U-shaped member with a lip 107 extending inward from each of the upper edges at the top of the "U". The slider beam 104 is a U-shaped member with a lip 109 extending outward from each of the upper edges at the top of the "U" constrained by the two lips 107 associated with the guide rail 106. The slider beam 104 is constrained to move only along the length of the guide rail 106 as shown in FIG. 1B. The chassis 102 is an I-shaped member extending from the "U" of the slider beam 104 and is constrained to move only along the length of the slider beam 104. The chassis 102 is constrained to the slider beam 104 via roller elements. Though this system does provide fairly reasonable vertical support, it is susceptible to anticlastic bending. Furthermore, the three stage system 100 shown in the prior art suffers from poor torsional stability. Hence, two or more slider systems, such as bottom mount sliders 100 and 120, are mounted to a surface 124 in parallel separated by a distance 122, to compensate for the poor torsional stability, as shown in FIG. 1C.

In an effort to improve torsion stability in a single bottom mount slider system while eliminating anticlastic bending in at least the slider beam both methods and apparatus are disclosed herein. It is to innovations related to this subject matter that the claimed invention is generally directed.

SUMMARY OF THE INVENTION

The present invention relates generally to a slider support arrangement that is useful in providing structural support in a geometrically constrained environment to a data storage element frame that is required to move in a drawer-like manner in and out of a data storage unit.

Embodiment of the present invention can therefore comprise a slide apparatus comprising: a slider beam possessing a top surface, a bottom surface, a first end, a second end and a slotted feature associated with at least the top surface that extends at least partially between the first end and the second end; a guide rail possessing a first guide rail end and a second guide rail end wherein the guide rail confronts the bottom surface of the slider beam and wherein the slider beam is confined by the guide rail to move essentially along the guide rail bidirectionally between the first guide rail end and the second guide rail end; a chassis possessing a first chassis end, a second chassis end and a chassis bottom surface wherein the chassis bottom surface confronts the top surface of the slider beam; and a retaining member anchored to the chassis and extended into the slotted feature, the slider beam confining the retaining member to move essentially only along the slotted feature.

Another embodiment of the present invention can therefore comprise a slide apparatus comprising: a slider beam possessing a top surface, a bottom surface, a first end, a second end and a slotted feature associated with at least the top surface that extends at least partially between the first end and the second end; a guide rail possessing a first guide rail end and a second guide rail end wherein the guide rail confronts the bottom surface of the slider beam and a means for confining the slider beam to move essentially between the first guide rail end and the second guide rail end; a chassis possessing a first chassis end, a second chassis end and a chassis bottom surface wherein the chassis bottom surface confronts the top surface of the slider beam; and a means for retaining the chassis to the slotted feature such that the chassis is confined to move essentially only along slider beam in a path following the slotted feature.

Yet another embodiment of the present invention can therefore comprise a slide apparatus comprising: a slider beam possessing a length, a first side rail member, a second side rail member and a center rail bridge member wherein the first side rail member is parallel to and in coextensive plane with the second side rail member, a space separating the first side rail from the second side rail member, the center rail member bridging the space and overlapping a portion of the first and the second side rail members, the center rail member residing at least partially out of the plane, at least two slots extending through and along the length of the center rail; a guide rail conforming to at least a portion of the first and second side rail members such that the slider beam is confined to moving along the guide rail via the first and second side rail members; a chassis facing the slider beam such that the slider beam is disposed substantially between the guide rail and the chassis; and at least two retaining elements anchored to the chassis, each retaining element extending through one of the at least two slots and into the space, wherein the retaining element confines the chassis to movement along the at least two slots.

Yet another embodiment of the present invention can therefore comprise a slide apparatus comprising: a guide rail adapted to be attached to a frame; a chassis; a slider beam disposed between the guide rail and the chassis, the slider beam extending in length between a first end and a second end, the slider beam adapted to cooperate with the guide rail to move along the guide rail in a direction along the length, the slider beam possessing a slotted feature that extends at least partially along the length; and a retaining member anchored to the chassis and extended into the slotted feature, such that the slider beam confines the retaining member to move essentially only along the slotted feature.

BRIEF DESCRIPTION OF THE DRAWINGS

FIGS. 1A, 1B and 1C are illustrations of typical prior art three stage bottom mount slider systems.

DETAILED DESCRIPTION

Figure 2A:
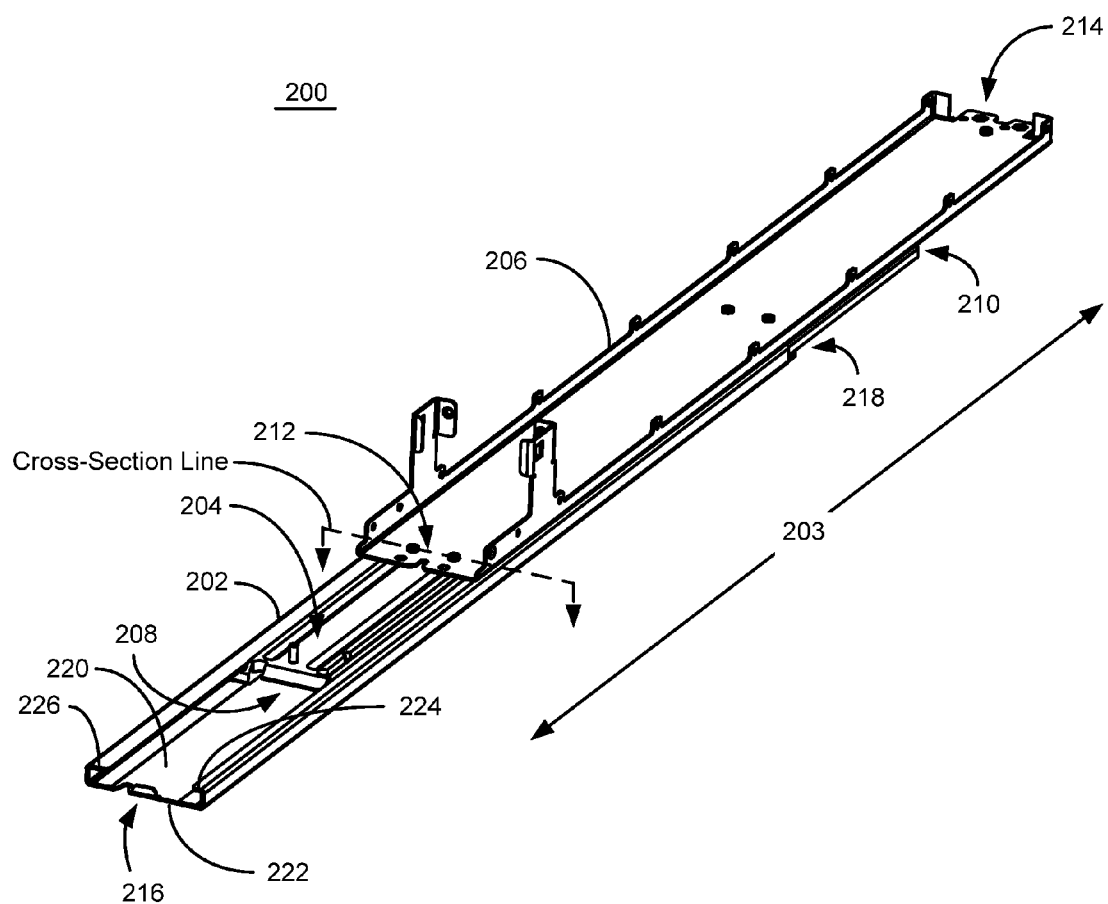
FIG. 2A is an isometric view of the slider arrangement constructed in accordance with one embodiment of the present invention.

Referring to the drawings in general, and more specifically to FIG. 2A, shown therein is an isometric view of a slider arrangement 200 constructed in accordance with an embodiment of the present invention. In what follows, similar or identical structure is identified using identical callouts.

FIG. 2A is an isometric view of the slider arrangement 200 constructed in accordance with one embodiment of the present invention. As illustratively shown, the slider arrangement 200 is a three stage slider apparatus which essentially comprises a slider beam 204 disposed between a guide rail 202 and a chassis 206. The guide rail 202 is adapted to be mounted in a stable position which immobilizes the guide rail 202. For example, the guide rail 202 can be mounted to a supporting frame (not shown) within a cabinet opening wherein the opening is used to accommodate a drawer (not shown). In such a configuration, the slider beam 204 and a chassis 206 are free to move in a direction 203 along the length of the guide rail 202, in and out of the drawer opening. A means for mounting the guide rail 202 in a stabilized position includes bolts, screws, nails, glue and welding, just to illustrate three examples.

Figure 2B:
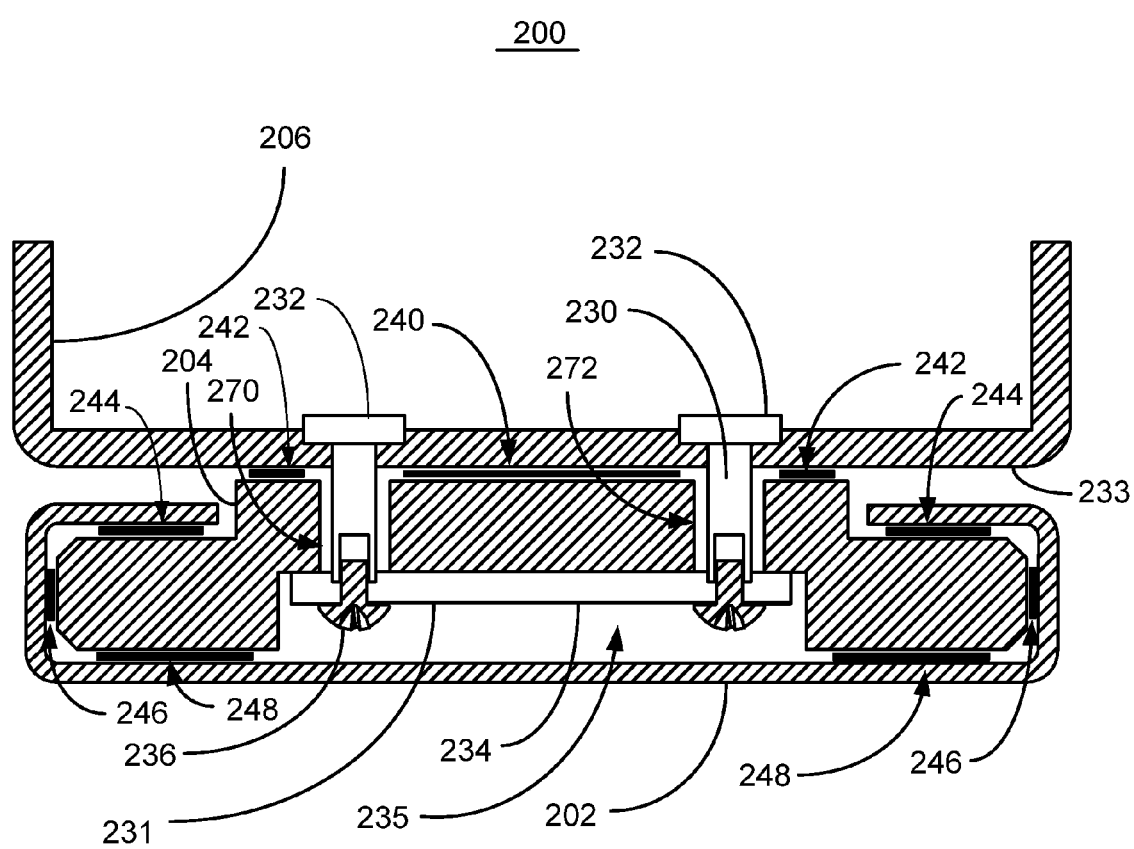
FIG. 2B is a cross-section illustrative view of the slider arrangement of FIG. 2A constructed in accordance with one embodiment of the present invention.

With further reference to FIG. 2A, in combination with the cross-section illustrative view of the slider arrangement 200 of FIG. 2B, the guide rail 202 is essentially constructed as a U-shaped cross-section with a first lip 224 and a second lip 226 that extend inwards, a length that extends between a first end 216 and a second end 218, and a top surface 220 and a bottom surface 222, as shown. In one embodiment, the guide rail 202 is formed steel sheet metal but, alternatively, can be constructed from a variety of materials in a variety of ways, such as extruded aluminum, for example. The guide rail 202 confines the slider beam 204, via the first and second lips 224 and 226, to move essentially along the guide rail 202 in a bidirectional path 203, which is back and forth, from the guide rail first end 216 to the guide rail second end 218. Hence, in the illustrated embodiment, the slider beam 204 can essentially move only along the length of said guide rail 202 and is confined from moving in any direction other than the path 203. In an optional embodiment, the slider beam 204 may be generally confined to moving along the path 203 with the exception of a specific location along the path wherein the slider beam 204 may be movable outside of the path 203 such as when the slider beam 204 is fully extended, for example. One example of moving outside the path 203 in a specific location can, for example, include pivoting, stepping up or stepping down when the chassis 206 is fully extended, such as for enhanced accessibility purposes.

Figure 2C:
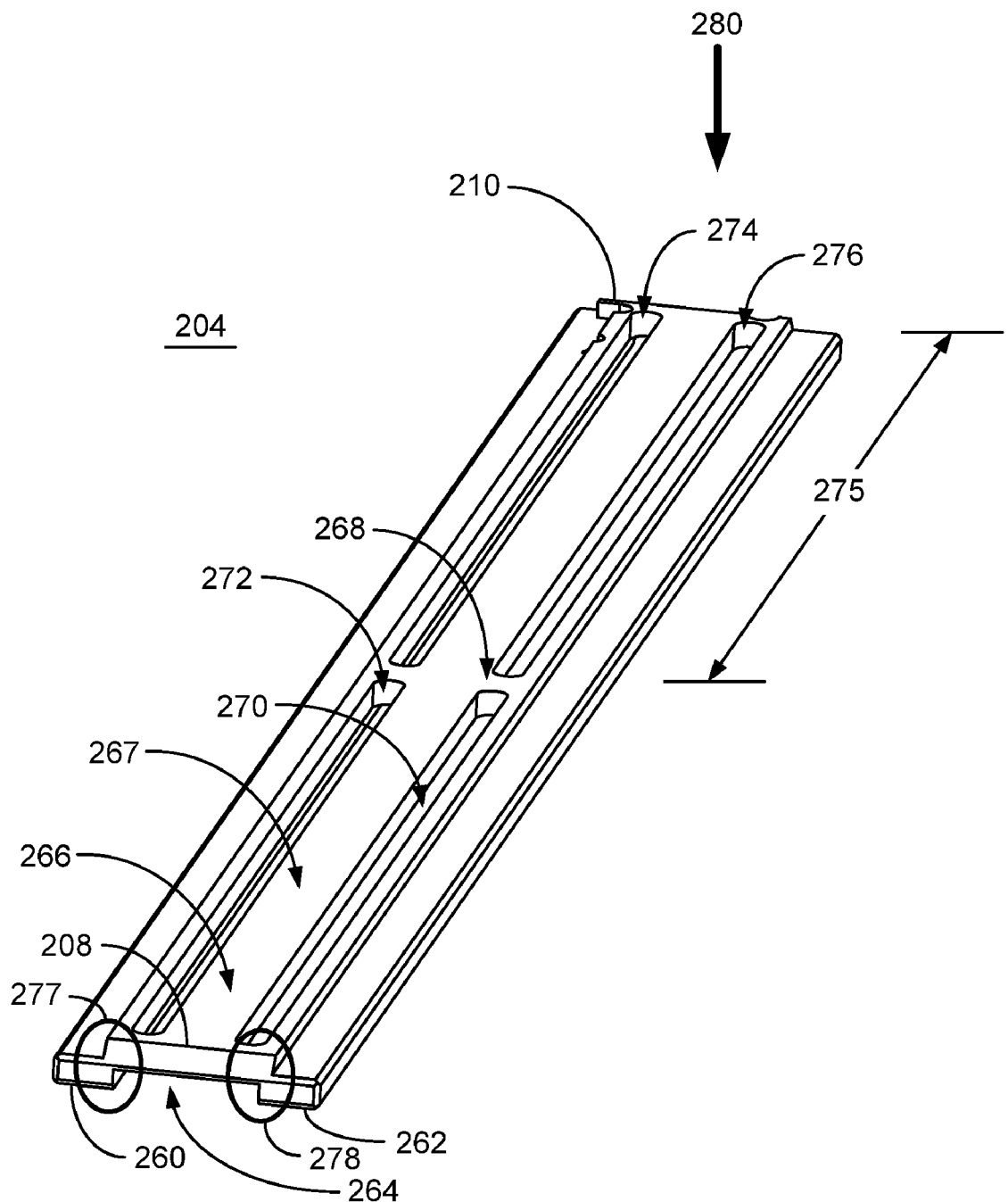
FIG. 2C is an isometric view of an embodiment of a slider beam consistent with embodiments of the present invention.

The slider beam 204, shown in an isometric view in FIG. 2C, provides large bending and torsion stiffness while substantially eliminating all anticlastic bending. The slider beam 204 extends in length between a first slider beam end 208 and a second slider beam end 210. As shown in conjunction with FIGS. 2A and 2B, the slider beam 204 possesses a first side rail 260 that is parallel to and in coextensive plane with a second side rail 262 wherein the first side rail 260 is separated from the second side rail 262 by a retaining element space 235. The retaining element space 235 is adapted to accommodate movement of a retaining element 234 along at least a portion of the length of the slider beam 204. A center rail bridge member 267 bridges the retaining element space 235 and extends partially over the first and second side rails 260 and 262 thereby creating overlapping portions 277 and 278. The overlapping portions 277 and 278 provide enhanced second moment of inertia for the slider beam 204 to thereby resist bending along the length of the slider beam 204 in the direction of the arrow 280. The bottom surface 264 of the slider beam 204 confronts the top surface 220 of the guide rail 202 in a sliding relationship wherein the sliding relationship, in one embodiment, is enhanced by an intermediate friction reducing pad or surface 248. One embodiment of the intermediate friction reducing surface 248 is an Ultra High Molecular Weight (UHMW) polyethylene, or optionally, a lubricious surface treatment such as a sputtered friction reducing material. As illustratively shown in FIG. 2B, the guide rail 202 essentially wraps around the first and second side rails 260 and 262 with the assistance of the inward lips 224 and 226. In the embodiment shown, a side intermediate friction reducing surface 246 disposed essentially along the vertical portion of the U-shaped guide rail 202 improves sliding the slider beam side 204 and the guide rail 202. Furthermore, in the embodiment shown, a horizontal intermediate friction reducing surface 244 is disposed between the guide rail lips 224 and 226 and the first and second side rails 260 and 262, respectively, to improve sliding the slider beam side 204 and the guide rail 202. Finally, the top surface 266 of the slider beam 204, and more specifically the center rail bridge member 267, accommodates chassis intermediate friction reducing surfaces 240 and 242 which reduce the sliding friction between the chassis bottom surface 233 and the slider beam top surface 266. As illustratively shown in FIG. 2C, the slider beam 204 possesses four slotted openings 270, 272, 274 and 276 that extend from the top surface 266 through the bottom surface 264 of the guide rail 204. Slotted openings 270 and 272 are in-line and separated from 276 and 274, respectively, by a torsion stiffening web 268 which, in the present embodiment, is a homogeneous portion of the slider beam 204, but alternatively can be a reinforced member attached to the slider beam region between the slotted openings.

With respect to the chassis 206, the bottom surface 233 of the chassis 206 faces the top surface 266 of the slider beam 204 such that the chassis 206 moves in the direction of the path 203. In the illustrative embodiment, the chassis 206 is constrained by the retaining element 231 from moving in essentially all directions other than the path 203. The retaining element 231 is anchored to the chassis 206 by an anchor means such as bolt anchor members 232. Alternatively, the retaining element 231 can be anchored by an anchor means such as a mechanically pressed shaft, an adhesive member to or a screw screwed into the chassis 206, just to name several examples. The slots 270 and 272 pass through the slider beam 204 creating elongated openings which accommodate a pair of shaft members 230 associated with the retaining element 231. The shaft members 230 are shown here extending through the slots 270 and 272 and may comprise the shafts of the bolt anchor members 232. As illustratively shown, the retaining element 231 further includes a cross member 234 that spans the shaft members 230 and is fixedly attached to the shaft members 230 via an attaching means, exemplified herein as a screw 236. The retaining element space 235 accommodates the cross member 234 such that the retaining element 231 and chassis 206 can freely move along the slots 270 and 272 in the slider beam 204 along the direction of the path 203. The chassis 206 can move only a maximum length 275 along the slider beam 204 determined by the torsion stiffening web 268 that separates the slotted features 274, 276 and 272, 270, respectively.

Figure 3:
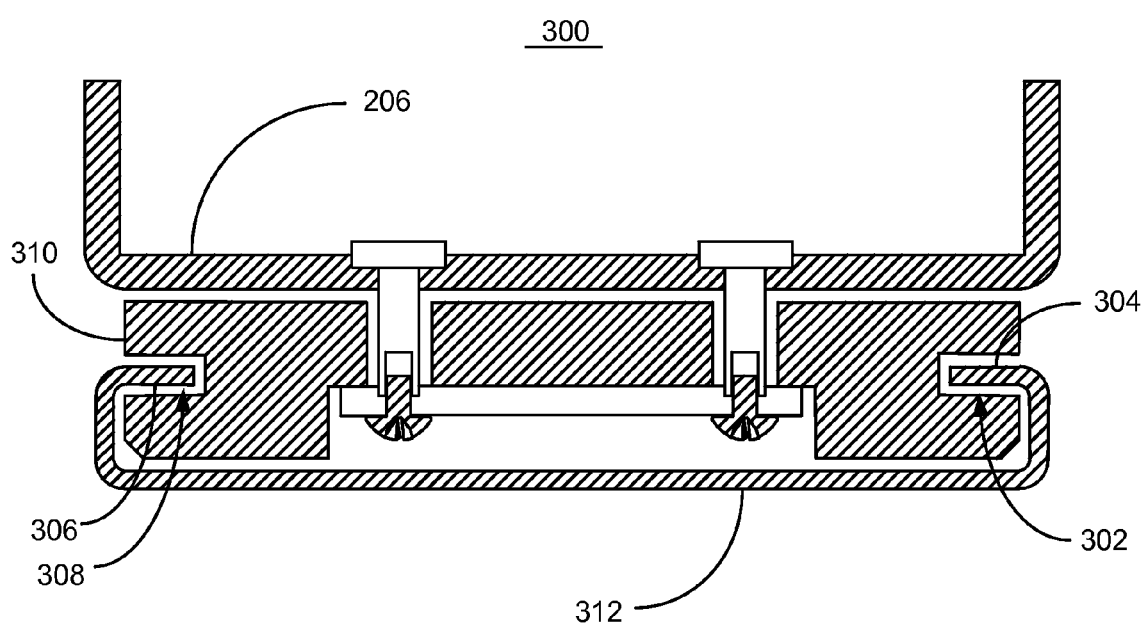
FIG. 3 is a cross-section illustrative view of an optional embodiment of a slider arrangement consistent with embodiments of the present invention.

FIG. 3 is a cross-section illustrative view of an optional embodiment of a slider arrangement 300 consistent with embodiments of the present invention. As illustratively shown, the lateral edges of the slider beam 310 possess a pair of side slots 302 and 308 adapted to accommodate a pair of inward facing guide rail lips 304 and 306 associated with the guide rail 312. In this embodiment, the inward facing guide rail lips 304 and 306 confine the slider beam 310 to move essentially only along the length guide rail 312. As will be appreciated by one skilled in the art, the characteristics and advantages of the guide rails 202 and 312 used with slider beams 204 and 310, respectively, are illustrative examples of several species of a means for confining the slider beam, such as slider beam 310, to move essentially only along the guide rail, such as the guide rail 312, and therefore changes may be made in detail within the principles and scope of the broad invention and without departing from the spirit of the present invention.

Figure 4:
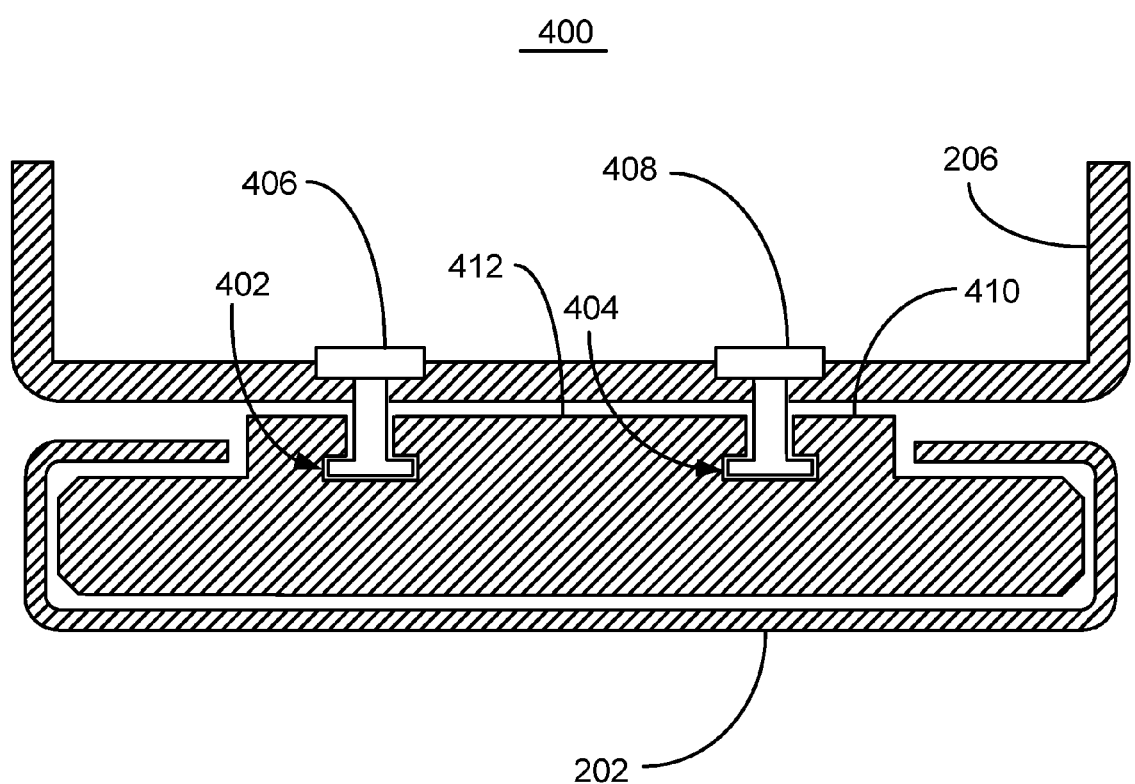
FIG. 4 is a cross-section illustrative view of an optional embodiment of a slider arrangement consistent with embodiments of the present invention.

FIG. 4 is a cross-section illustrative view of an optional embodiment of a slider arrangement 400 consistent with embodiments of the present invention. As illustratively shown, the slider beam 410 possesses a first slotted feature 402 and a second slotted feature 404 with a contoured shape, notably shaped like a keyhole, which extends only partially into the top surface 412 of the slider beam 410. The slotted features 402 and 404 extend at least partially between the ends of the slider beam 410 along the length of the slider beam 410 (similarly as the slots 274 and 276 shown between the first and second end 208 and 210 of the slider beam 204 from FIG. 2C). The chassis 206 is confined to moving along the slotted features 402 and 404 via respective retaining elements 406 and 408. As illustratively shown, the retaining elements 406 and 408 are key shaped to essentially conform to the keyhole shaped slotted features 402 and 404 wherein the retaining elements 406 and 408 fit inside the slotted features 402 and 404 with sufficient clearance to move within and along the length of the slotted features 402 and 404.

Figure 5:
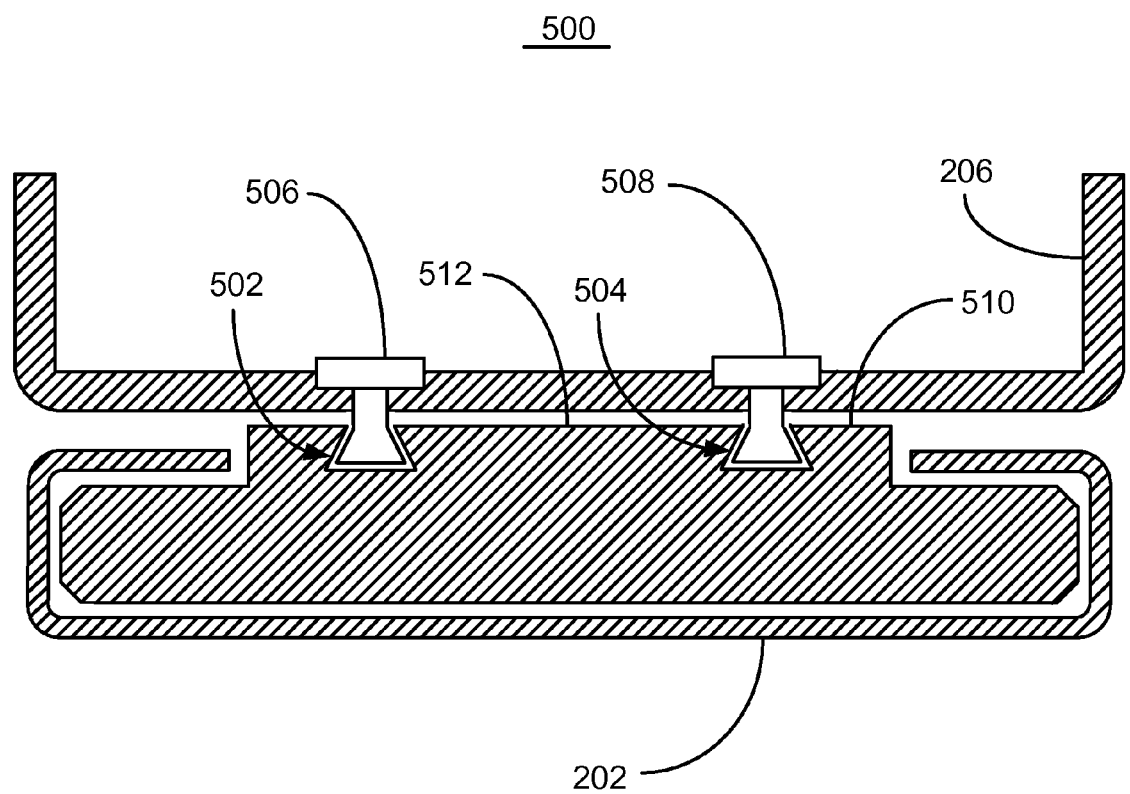
FIG. 5 is a cross-section illustrative view of an optional embodiment of a slider arrangement consistent with embodiments of the present invention.

FIG. 5 is a cross-section illustrative view of an optional embodiment of a slider arrangement 500 consistent with embodiments of the present invention. As illustratively shown, the slider beam 510 possesses a first and second slotted feature 502 and 504 with a contoured shape, notably shaped like a dovetail, which extends only partially into the top surface 512 of the slider beam 510. The slotted features 502 and 504 extend at least partially between the ends of the slider beam 510 along the length of the slider beam 510 (similarly as the slots 274 and 276 shown between the first and second end 208 and 210 of the slider beam 204 from FIG. 2C). The chassis 206 is confined to moving along the slotted features 502 and 504 via respective retaining elements 506 and 508. As illustratively shown, the retaining elements 506 and 508 are dovetail shaped to essentially conform to the dovetail shaped slotted features 502 and 504 wherein the retaining elements 506 and 508 fit inside the slotted features 502 and 504 with sufficient clearance to move within the slotted features 502 and 504. The slotted features of FIGS. 2A, 4 and 5 are illustrative examples of several means for confining the slider beam to a chassis 206, and more specifically, optional means for the slider beam to be mechanically retained in a contoured shaped feature, wherein the chassis 206 can move along the length of the slider beam via the slotted features. Thus, changes may be made in detail within the principles and scope of the broad invention without departing from the spirit of the present invention.

Figure 6:
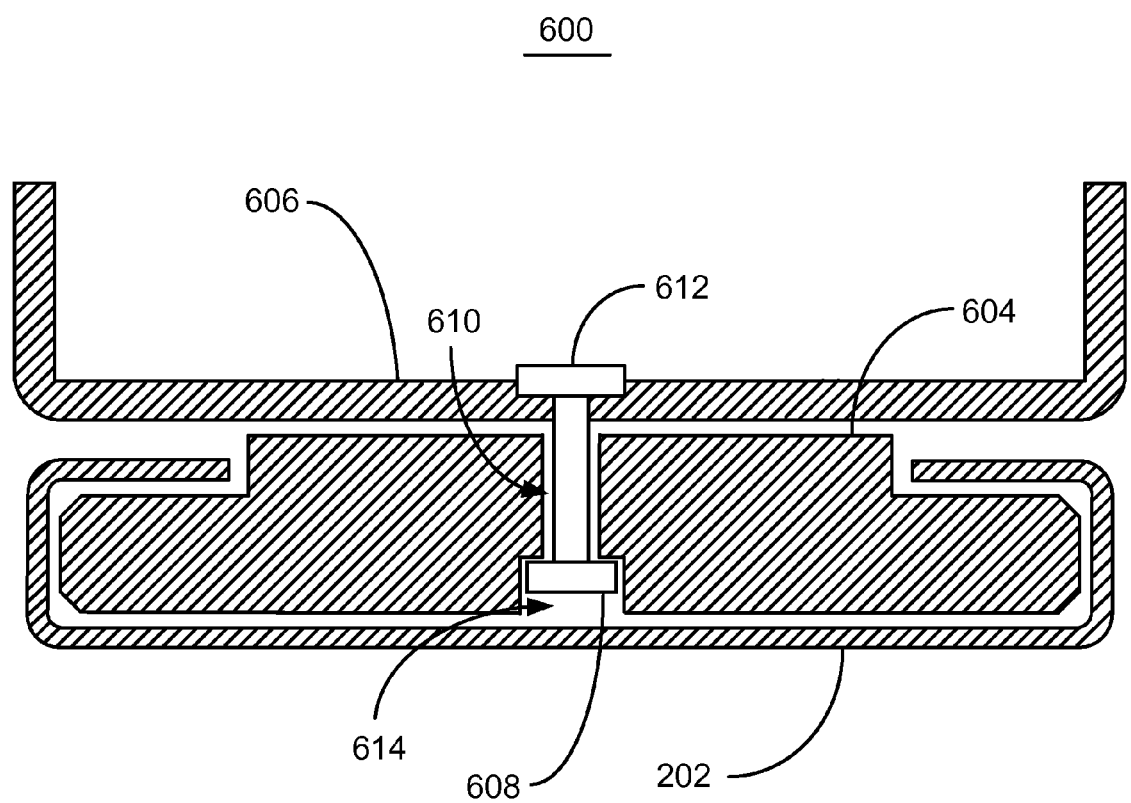
FIG. 6 is a cross-section illustrative view of an optional embodiment of a slider arrangement consistent with embodiments of the present invention.

FIG. 6 is a cross-section illustrative view of an optional embodiment of a slider arrangement 600 consistent with embodiments of the present invention. As illustratively shown, the slider beam 604 possesses a slotted feature 610 which extends though the slider beam 604. The slotted feature 610 extend at least partially between the ends of the slider beam 604 along the length of the slider beam 604 (similarly as the slots 274 and 276 shown between the first and second end 208 and 210 of the slider beam 204 from FIG. 2C). The retaining element 612 extends through the slotted feature 610 and retains the slider beam 604 to the chassis 606 by a locking member 608 that is larger than the slotted feature 610. As shown, there is sufficient clearance in the accommodating space 614 for the retaining element 612 and locking member 608 to move unobstructed within the slotted feature 610 along at the length of the slotted feature or features 610. Hence, the chassis 606 is confined to moving along the slotted feature 610 via respective retaining element 612. In optional embodiments, the slider beam 604 can possess multiple slotted features.

Figure 7:
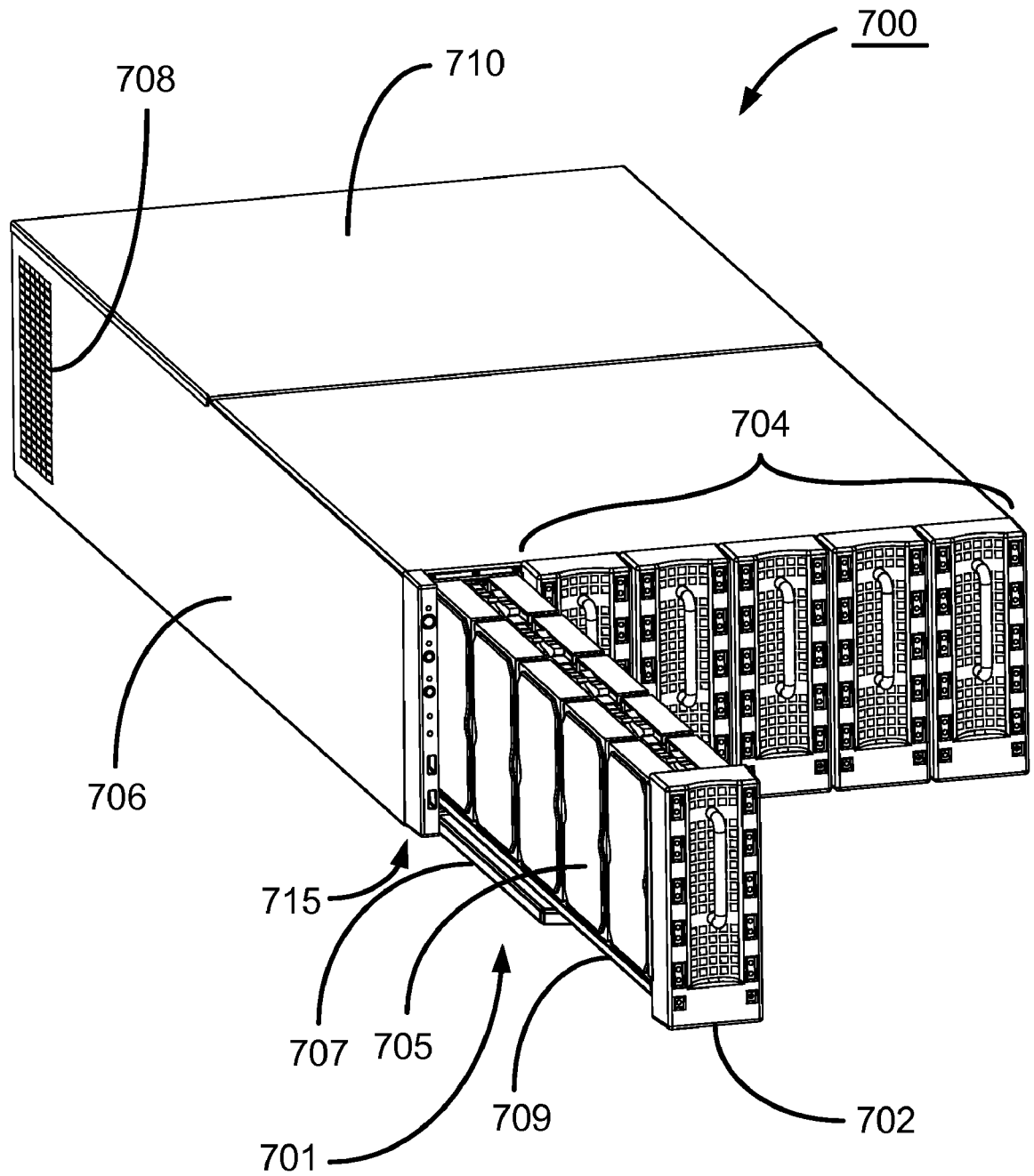
FIG. 7 is an illustration of a perspective view of a commercial embodiment of a High Density Array (HDA) unit consistent with embodiments of the present invention.

Embodiments of the present invention can be commercially practiced in a Spectra Logic D-700 library manufactured by Spectra Logic of Boulder, Colo. FIG. 7 shows a commercial embodiment of one D-700 unit 700 with a first storage media blade 702, comprising ten disc drives 705, shown in an extended position, and five additional storage media blades 704, each capable of comprising ten disc drives 705, or less, each in a fully retracted position. As shown, the media blade 702 is supported by a three stage slider apparatus 701, similar to the slider apparatus 200 shown in FIG. 2A, that supports the media blade 702 when extended. The three stage support 701 is attached to the base 715 of the D-700 unit 700 frame via a guide rail (element 801 shown in FIG. 8), similar to the guide rail 202. The guide rail can be attached by screws or bolts, for example. As shown, the media blade 702 is integrated with the chassis 709 which is resting on a slider beam 707, in a construction similar to that shown in FIG. 2A. The media blade 702 is moved in a drawer-like manner as shown; that is, from a first position that may be substantially in the D-700 unit 700 to a second position being fully extended, and there between. The three stage slider apparatus 701 when fully extended is held in place by the slots and retaining element, such as the slots 274 and 276 and retaining element 234. In other words the slider beam 707 and said slider rail (element 801 shown in FIG. 8) are constrained to remain in contact, and the slider beam 707 and chassis 709 are constrained to remain in contact when the media blade 702 is in the fully extended position.

As illustratively shown, the media blade 702 can be moved substantially in and out of the D-700 unit 700 via an accommodating opening in the D-700 unit 700 tailored and specifically for the media blade 702. The media blade 704 can be optimized for load balancing, power balancing, capacity balancing, etc. In one option, power and communication can be provided to the storage media blades 702 and 704 without interruption regardless of whether the storage media blades 702 and 704 are in a retracted position, extended position, or a position there between. In other words, the storage media blade 704 can be in a power state independent of the location of the blade 704 along the three stage slider apparatus 701. Each blade 702 and 704 can be configured to store data with back-up capabilities such as in a RAID (Redundant Array of Independent Disc [drives]) configuration, for example RAID level-1 or RAID level-5. In an alternative embodiment, back-up configurations can be accomplished by writing redundant data across different blades 702 and 704 or across multiple D-700 units that are interconnected. The D-700 unit 700 is substantially encased on four sides (top, bottom, left side and right side) by a cover 706 and a removable panel 710 which define an interior space of the D-700 unit 700. A vent 708 is provided in the cover 706 for cooling purposes which, as known by a skilled artisan, is not limited by quantity, size or location.

Figure 8:
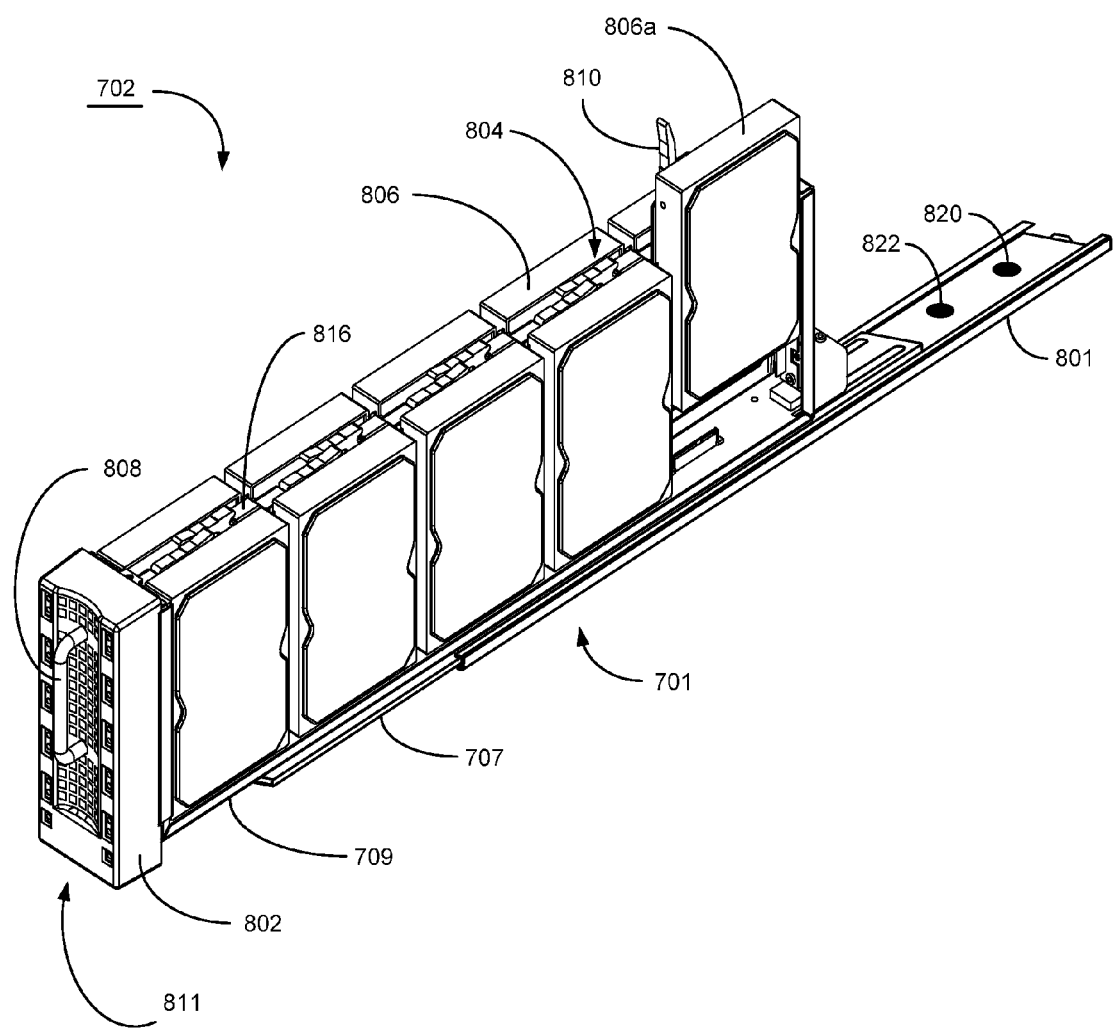
FIG. 8 is an illustration of a perspective view of a commercial configuration of a three stage slider support arrangement supporting a storage media blade populated with ten disc drives consistent with embodiments of the present invention.

With reference to FIG. 8, shown therein is a commercial configuration of the storage media blade 702 and three stage support 701 from FIG. 7 populated with ten 3.5 inch form factor disc drives 206, such as a Barracuda class disc drive manufactured by Seagate Corporation of Scotts Valley, Calif. Optionally, the storage media blade 702 can accommodate different form factor drives, such as 2.5 inch disc drive and 3.5 inch disc drive for example. The storage media blade 702 is integrated with the chassis 709 and the three stage support 701. The three stage support 701 is shown partially extended revealing a portion of the slider beam 707 in the guide rail 801. The guide rail 801 is adapted to be attached to the base 715 of the D-700 unit 700 of FIG. 7 via a plurality of bolts, such as the bolts 820 and 822 that are revealed. The slider beam 707, and more specifically, the center rail bridge member, similar to the center rail bridge member 267 of FIG. 2C, extends twenty percent beyond the top of the guide rail 801 to provide a large second moment of inertia via overlapping portions, such as the portion 277 and 278 of FIG. 2C. In addition to the disc drives 206, the storage media blade 702 is shown comprising a bezel module 802 with a handle 808 at a front end 810, a chassis 709 which supports a blade plate board (not shown) for providing power to the disc drives 806 and a mid-plane frame 816 shown interposed between the drives 806 which can cooperate with retaining mechanisms 804 wherein a retaining mechanism 804 can further comprise a latch 810. As illustrated, a disc drive 806a is partially ejected from the chassis 814. In this embodiment, the disc drives 806 are oppositely disposed relative the mid-plane frame 816 providing the added advantage of oppositely rotating discs (not shown) comprised by the disc drives 806 reducing the vibration of the storage media blade 702 when fully populated. Additional vibration control means can be provided, such as dampeners and wedge shaped locking mechanisms associated with the blade 702, just to name a couple of examples.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, alternate means for retaining a chassis to the slotted feature such that the slider beam is confined to move essentially only along the slotted feature could include alternate shaped retaining elements that conform to the slotted feature, magnetic retaining elements or constraining bearing devices, for example, while still maintaining substantially the same functionality without departing from the scope and spirit of the present invention. Another example can include providing alternative torsion stiffening features in addition to or in place of the torsion stiffening web 268 while still maintaining substantially the same functionality without departing from the scope and spirit of the present invention. Although the preferred embodiments described herein are directed to storage systems, such as the disc drive blade 702, and related technology, it will be appreciated by those skilled in the art that the teachings of the present invention can be applied to other systems and storage media, without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed.

What is claimed is:

1. A slide apparatus comprising:
    a slider beam possessing a top surface, a bottom surface, a first end, a second end and a first and a second in-line slotted feature separated by a torsion stiffening web associated with at least said top surface that extend at least partially between said first end and said second end;
    a guide rail possessing a first guide rail end and a second guide rail end wherein said guide rail confronts said bottom surface of said slider beam and wherein said slider beam is confined by said guide rail to move essentially along said guide rail bidirectionally between said first guide rail end and said second guide rail end;
    a chassis possessing a first chassis end, a second chassis end and a chassis bottom surface wherein said chassis bottom surface confronts said top surface of said slider beam; and
    a retaining member anchored to said chassis and extended into said first slotted feature, said slider beam confining said retaining member to move essentially only along said slotted feature.

2. The slide apparatus of claim 1 wherein said slotted features extends entirely through said slider beam bottom surface creating a slotted openings.

3. The slider apparatus of claim 2 further comprising a third and fourth slotted feature substantially similar in configuration, spaced from and running parallel to said first and said second slotted feature.

4. The slider apparatus of claim 3 wherein said retaining member extends through said first slotted feature and said third slotted feature and retains said slider beam to said chassis by a cross member that extends between said first slotted feature and said third slotted feature, said cross member is substantially located in an accommodating space in said bottom surface of said slider beam.

5. The slider apparatus of claim 2 wherein said retaining member extends through said first slotted feature and retains said slider beam to said chassis by a locking member that is larger than said first slotted feature located in proximity to said bottom surface of said slider beam.

6. The slide apparatus of claim 5 wherein said slider beam provides an accommodating space in said bottom surface for said retaining member such that said retaining member is devoid of obstructing said guide rail from moving along the length of said first slotted feature.

7. The slider apparatus of claim 1 wherein said first slotted feature possesses a contoured shaped feature that extends partially into said slider beam and wherein said retaining member provides a means for being mechanically retained in said contoured shaped feature.

8. The slider apparatus of claim 1 wherein said guide rail confines said slider beam by conforming to a portion of said slider beam.

9. The slider apparatus of claim 1 wherein said slider beam extends at least twenty percent beyond said guide rail.

10. The a slider apparatus of claim 1 wherein said slider beam, said guide rail and said chassis are all substantially the same width.

11. The slider apparatus of claim 1 further comprising a friction reducing surface disposed between said slider beam and said guide rail.

12. The slider apparatus of claim 11 wherein said friction reducing surface is selected from the group consisting of: Teflon, Ultra High Molecular Weight polyethylene, lubricious surface treatments.

13. The slider apparatus of claim 1 wherein said chassis is integrated with a media blade assembly that supports disc drives, wherein each of said disc drives possessing an outer enclosure having a length that is longer than a width that is longer than a height, each of said disc drives extending vertically from said chassis by said length.

14. The slider apparatus of claim 1 wherein said chassis, said slider beam and said slider rail are adapted to move between a fully extended position and a fully retracted position.

15. A slide apparatus comprising:
a slider beam possessing a top surface, a bottom surface, a first end, a second end and a first and a second in-line slotted feature separated by a torsion stiffening web associated with at least said top surface that extends at least partially between said first end and said second end;
a guide rail possessing a first guide rail end and a second guide rail end wherein said guide rail confronts said bottom surface of said slider beam and a means for confining said slider beam to move essentially between said first guide rail end and said second guide rail end;
a chassis possessing a first chassis end, a second chassis end and a chassis bottom surface wherein said chassis bottom surface confronts said top surface of said slider beam; and
a means for retaining said chassis to said slotted feature such that said chassis is confined to move essentially only along slider beam in a path following said slotted feature.

16. The slider apparatus of claim 15 wherein said means for confining is selected from the group consisting of: a slidable anchor, conforming sheet-metal around a feature in said slider beam, a track with a retaining groove, and conforming sheet-metal extending into a slot in the said slider beam.

17. The slider apparatus of claim 15 wherein said means for retaining is selected from the group consisting of: a dovetail, a wheel, a key member, a bar, and a crossbar.

18. A slide apparatus comprising:
a slider beam possessing a length, a first side rail member, a second side rail member and a center rail bridge member wherein said first side rail member is parallel to and in coextensive plane with said second side rail member, a space separating said first side rail from said second side rail member, said center rail member bridging said space and overlapping a portion of said first and said second side rail members, said center rail member residing at least partially out of said plane, at least two slots separated by a torsion stiffening web extending through and along said length of said center rail;
a guide rail conforming to at least a portion of said first and second side rail members such that said slider beam is confined to moving along said guide rail via said first and second side rail members;
a chassis facing said slider beam such that said slider beam is disposed substantially between said guide rail and said chassis; and
at least two retaining elements anchored to said chassis, each retaining element extending through one of said at least two slots and into said space, wherein said retaining element confines said chassis to movement along said at least two slots.

19. A slide apparatus comprising:
a guide rail adapted to be attached to a frame;
a chassis;
a slider beam disposed between said guide rail and said chassis, said slider beam extending in length between a first end and a second end, said slider beam adapted to cooperate with said guide rail to move along said guide rail in a direction along said length, said slider beam possessing a slotted feature separated by a torsion stiffening web that extends at least partially along said length; and
a retaining member anchored to said chassis and extended into said slotted feature, such that said slider beam confines said retaining member to move essentially only along said slotted feature.

20. The slider for as of claim 13 wherein all of said disc drives possess discs and wherein at least one of said discs associated with one of said disc drives rotates in an opposite direction relative to at least one of said discs associated with another of said disc drives.

21. The slide apparatus of claim 1 wherein said second slotted feature is adapted to cooperate with a second retaining member.

* * * * *